United States Patent
Lin

[11] Patent Number: 5,982,601
[45] Date of Patent: Nov. 9, 1999

[54] DIRECT TRANSIENT-TRIGGERED SCR FOR ESD PROTECTION

[75] Inventor: Shi-Tron Lin, Hsinchu, Taiwan

[73] Assignee: Winbond Electronics Corp., Taiwan

[21] Appl. No.: 09/126,196

[22] Filed: Jul. 30, 1998

[51] Int. Cl.[6] .................................................. H02H 3/22
[52] U.S. Cl. ............................................. 361/111; 361/56
[58] Field of Search .............................. 361/56, 91, 111; 257/355–362

[56] References Cited

U.S. PATENT DOCUMENTS

| | | | |
|---|---|---|---|
| 5,528,188 | 6/1996 | Au et al. | 327/310 |
| 5,541,801 | 7/1996 | Lee et al. | 361/56 |
| 5,734,541 | 3/1998 | Iniewski et al. | 361/111 |
| 5,852,541 | 12/1998 | Lin et al. | 361/111 |

*Primary Examiner*—Michael J. Sherry
*Attorney, Agent, or Firm*—Fulbright & Jaworski

[57] ABSTRACT

An electrostatic discharge (ESD) protection structure for an integrated circuit constructed on a semiconductor substrate of a first type (P) comprises a semiconductor controlled rectifier (SCR) formed on the substrate and coupled to the integrated circuit and a transient voltage oscillation circuit, the SCR including a first region of a second type (nwell) formed within the semiconductor substrate and a second region of the first type (P) positioned within the first region, the transient voltage oscillation circuit being coupled to the first region and is adapted to forward-bias a junction between the second region and the first region (P+/nwell junction) at least once during an ESD transient period for earlier triggering the SCR during the ESD event, thereby improving the ESD performance of the SCR ESD protection circuit used for protecting a power bus of the integrated circuit or an IC pin connected to the integrated circuit during an ESD event.

27 Claims, 8 Drawing Sheets

DIRECT TRANSIENT-TRIGGERED SCR FOR ESD PROTECTION

FIELD OF INVENTION

The invention relates to an ESD protection device employing the SCR.

BACKGROUND OF THE INVENTION

In a Human-Body-Model ESD transient, an 100 PF capacitor is first charged up to an ESD zapping voltage, and then discharges through a 1.5 kohms resistor onto an IC pin. For instance, a zapping voltage level of 2 KV is used to qualify an IC package. The initial peak current is roughly 1.2 A with a rise time of approximately 10 nsec. For integrated circuit packages, the VDD-to-VSS capacitance is typically larger than 1 nF. If the ESD energy is directly absorbed by the power bus, i.e. for ESD stress of VDD pin to VSS pin, or indirectly absorbed by the power bus, i.e. the positive ESD stress on an input or I/O pin that has a pull up device, then the voltage-rising rate inside an IC may reach 1 to 2 volt per nano-second for a Human-Body-Model ESD zapping at 2 to 3 KV level. The pull up device includes p+/nwell diode or PMOSFET.

Transistors, such as grounded-gate NMOS(GGNMOS), field-oxide MOSFET, output buffer transistors, or bipolar transistors, have been commonly used as primary ESD protection elements for integrated circuits. A Semiconductor Controlled Rectifier (SCR), typically including pnpn junctions, can also be used as primary ESD protection device for protecting an IC pin or a power bus during an ESD event. "ESD in Silicon Integrated Circuits" by A. Amerasekera and C. Duvvury, Chap. 3 and 4, John Wiley & Sons, 1995, provides a basic introduction for an SCR used as an ESD protection device.

FIGS. 1A, 1B and 1C Shows the basic structure of an SCR. The anode of an SCR can be connected to an IC pin, while the cathode of the SCR can be connected to ground, for ESD protection of an IC pin. Alternatively, the anode can be connected to VDD bus to prevent the internal circuit from being damaged during an ESD event from the power bus. The conventional SCR is triggered by the nwell to p-substrate junction breakdown, which is relatively high, for instance, typically >20 V. This is a drawback when an SCR is used as an ESD protection element since it may not trigger sooner enough during an ESD event to protect other circuit elements from ESD damages.

U.S. Pat. No. 5,465,189 describes an SCR used to provide on-chip protection against ESD stress applied at the input, output, power-supply bus, or between any arbitrary pair of pins of an integrated circuit. A novel structure in the patent having a low breakdown voltage is incorporated into the SCR to lower the trigger voltage of the SCR. FIG. 2A shows the low-voltage trigger SCR, according to U.S. Pat. No. 5,465,189, which integrates an NMOSFET with the SCR, such that the trigger voltage of the SCR is equal to the trigger voltage of an NMOSFET, which is typically roughly at or lower than 12 volts.

FIG. 3 shows an example of full-chip ESD protection scheme. The ESD protection of the input pin consists of a resistor R1, a diode D1 pull-up device, a diode D2 pull-down device. The ESD protection of an output pin relies on the output buffer, e.g. pull-up PMOS and pull-down NMOS, for self protection during an ESD event. Also shown in FIG. 3, the VDD bus potential can be pulled high through a pull-up p+/nwell diode or a pull-up PMOS. And similarly, the VSS bus potential can be pulled low through a pull-down n+/pwell diode or a pull-down NMOS. Therefore, the VDD to VSS voltage difference can be rapidly higher than 10 volt during an ESD events including the following situations: (i) positive stress of VDD pin to VSS pin, (ii) negative stress of VSS pin to VDD pin, (iii) positive stress on an input or I/O pin while the pin is connected to a pull-up (p+nwell) diode or a pull-up PMOS, or (iv) negative stress on an input or I/O pin while the pin is connected to a pull-down (n+/pwell) diode or a pull-down NMOS. Therefore, it is a common practice to include ESD protection elements, such as an SCR device S1, between VDD and VSS bus to protect the power bus and the internal circuit from being damaged during an ESD event.

It is of great advantage to lower the trigger voltage of an ESD protection device during an ESD event. As the ESD protection functions sooner, and the transient voltage imposed on the I/O and internal circuit can be lower which provides a better overall ESD protection.

FIG. 4 discloses prior-art SCR along with other ESD protection devices that are used to protect the input pad of an IC chip.

SUMMARY OF INVENTION

An electrostatic discharge (ESD) protection structure for an integrated circuit constructed on a substrate of a first type is provided.

The protection structure includes a semiconductor controlled rectifier (SCR) and a transient oscillation circuit.

The semiconductor controlled rectifier (SCR) is constructed on the substrate and coupled to the integrated circuit and the SCR includes a first region of a second type formed within the substrate.

A transient voltage oscillation circuit is coupled to the first region for forward-biasing the junction at the second region and the first region (P+/nwell junction) at least once during the ESD transient for earlier triggering said SCR during the ESD event. The present invention improves the ESD performance of an SCR ESD protection circuit which is used for protecting the power bus or an IC pin during an ESD event.

BRIEF DESCRIPTION OF THE APPENDED DRAWINGS

FIG. 1A and FIG. 1B show an SCR structure and FIG. 1C shows the cross section view of SCR.

FIG. 2 shows the low voltage triggering SCR in accordance with U.S. Pat. No. 5,465,189.

Figure 9:
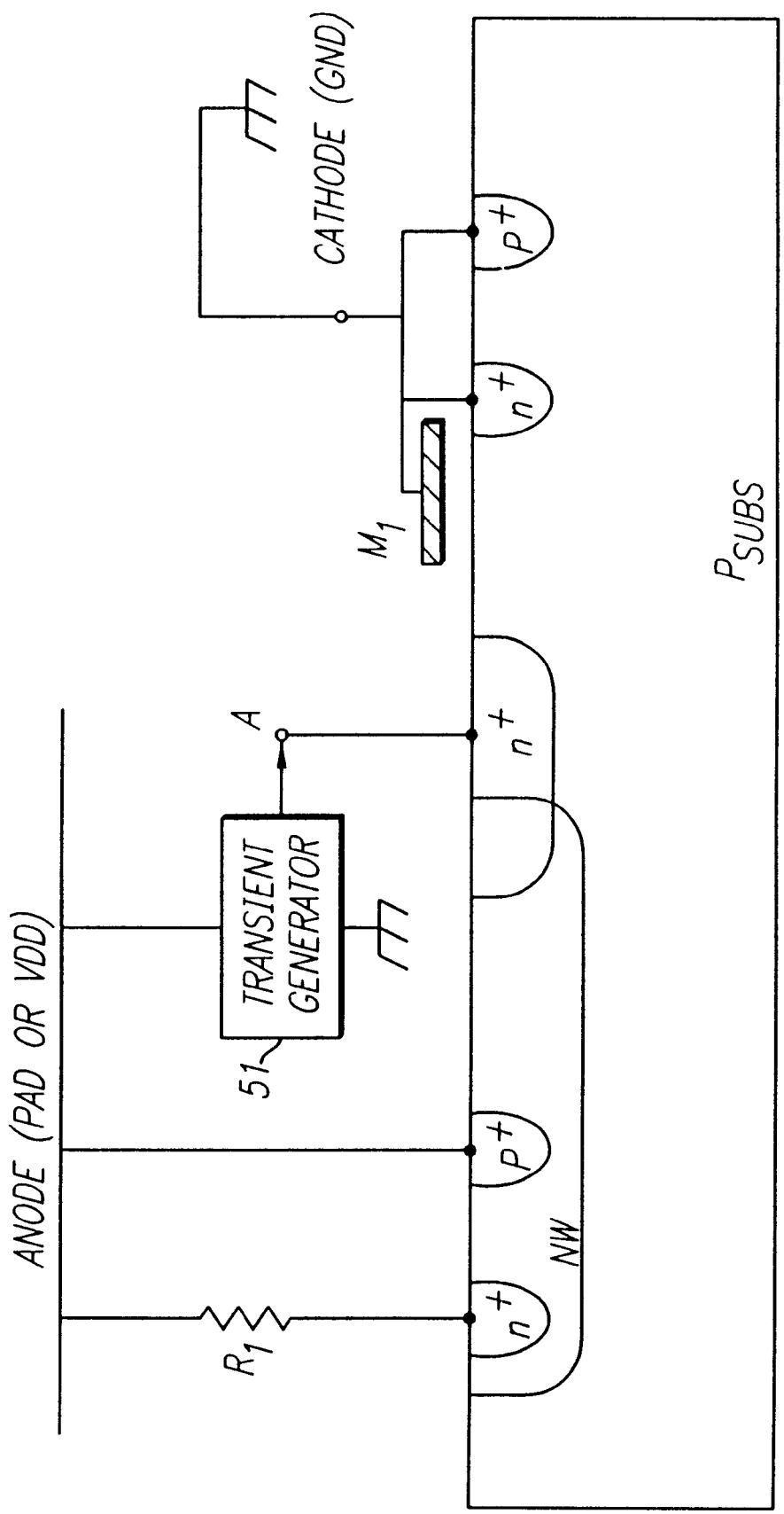

FIG. 9 shows section view of the invention when employing the teaching of U.S. Pat. No. 5,465,189.

Figure 10:
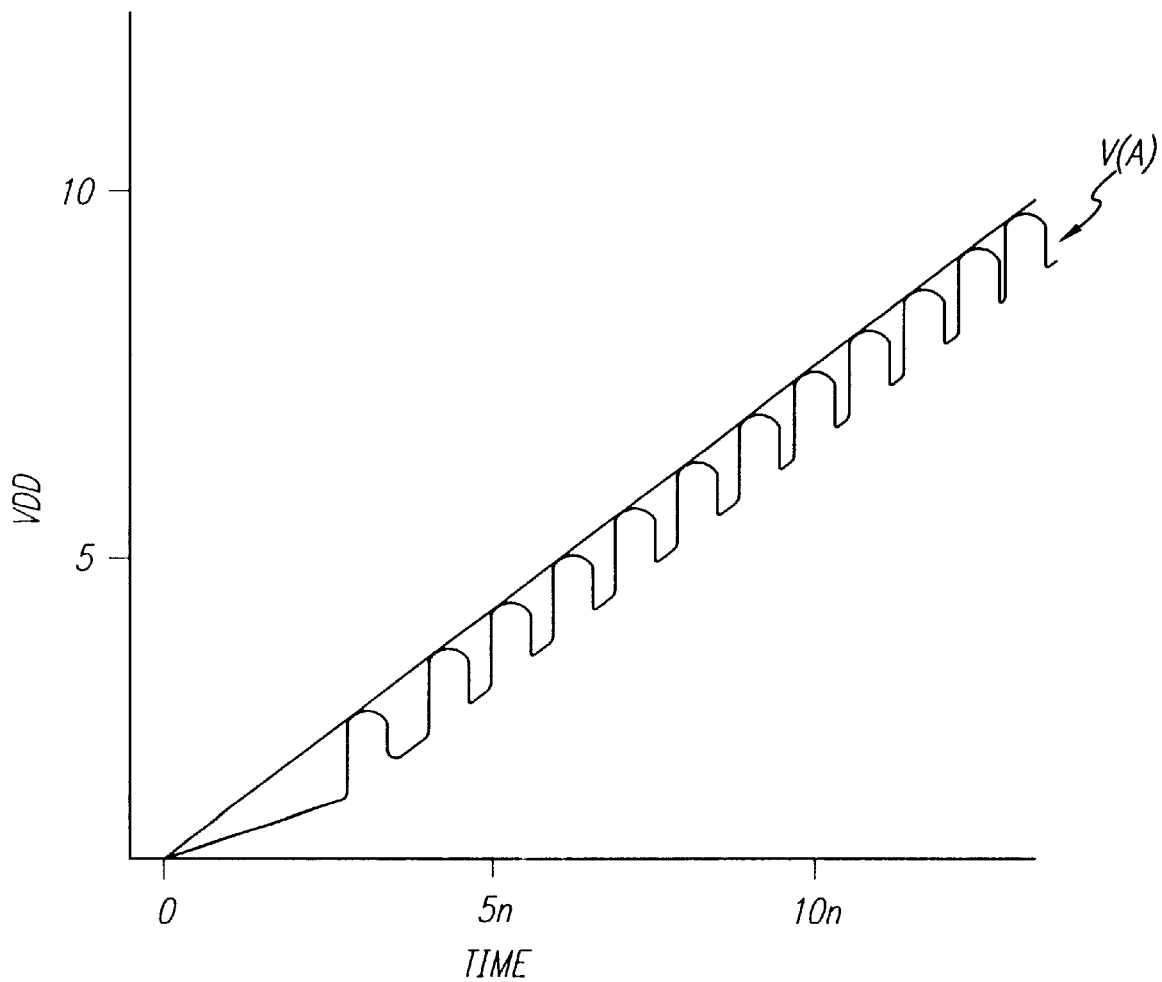

FIG. 10. shows the simulation result of the voltages at node A.

DESCRIPTION OF THE PREFERRED EMBODIMENTS

Figure 5:
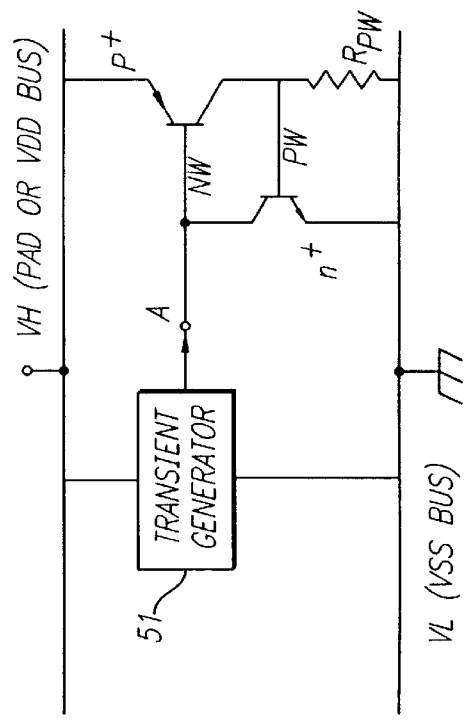
FIG. 5 shows essence of the invention.

Referring to FIG. 5, the essence of the invention has a voltage-transition circuit 51 connected to the nwell of the SCR for providing a voltage transition such that the P+/nwell junction of SCR is forward biased a number of times, including once, during early stage of an ESD event for early trigger of the SCR. In particular, the voltage transition has ramp rate faster than the ESD transient voltage's ramp rate. In particular, the voltage transition is in the opposite direction to the ESD transient voltage. The forward biased PN junction injects lots of carriers such that the nwell to pwell (or p-substrate) junction can be breakdown sooner at an earlier ESD transient. The SCR is constructed on a base region and coupled to the integrated circuit. The SCR includes a first region of a second type formed next to the base region. A second region of the first type is formed in the first region and a third region of the second type is formed in the base region.

In a preferred embodiment, the first type is P type and the second type is n type.

As shown, the second region is coupled to a first bus electrically coupled to an ESD transient voltage source. And the first bus is a power bus.

Figures 1A, 1B, 1C:
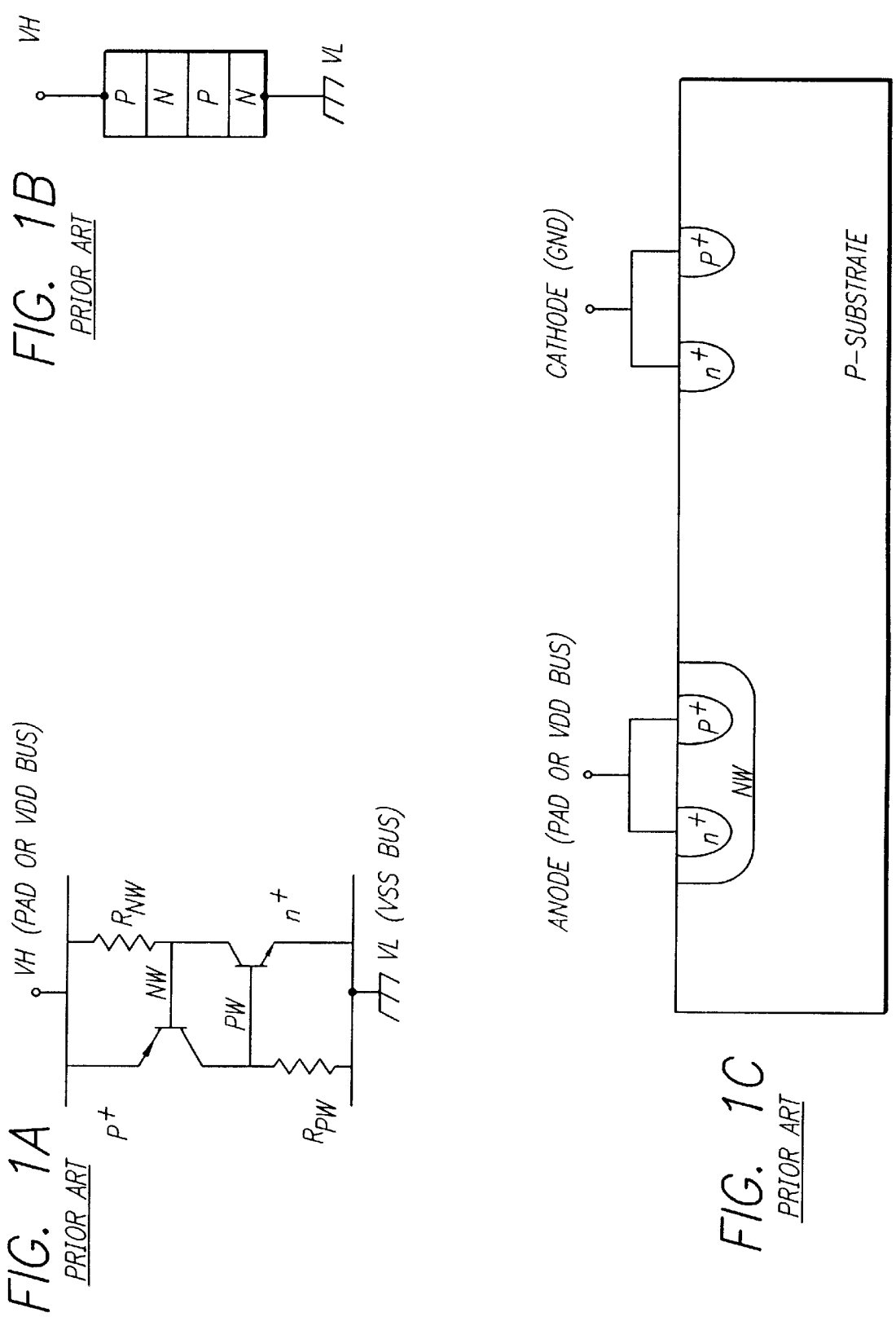
Figure 2:
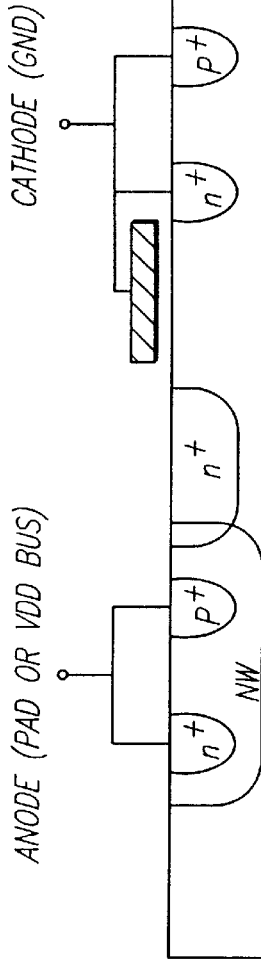
Figure 3:
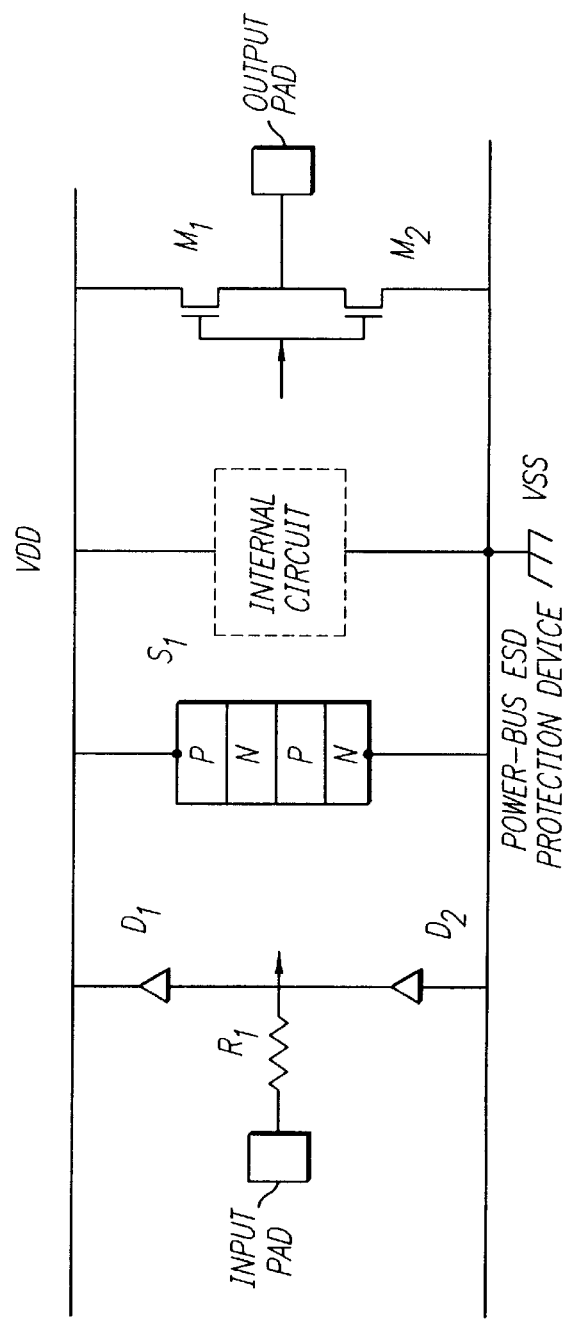
FIG. 3 shows a complete ESD protection scheme in accordance with the prior arts.
Figure 4:
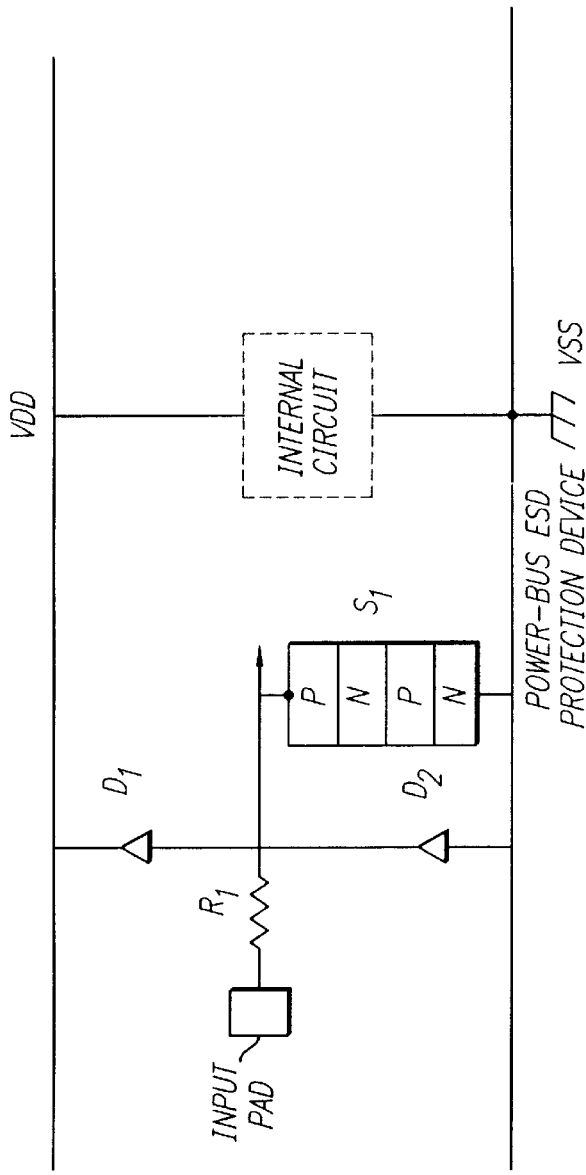
FIG. 4 shows different arrangement of SCR within an IC chip to protect the input pad of the IC.

Not shown in FIG. 5, a diode may be disposed between the first bus and an IC pin receiving the ESD transient voltage similar to that shown in FIGS. 3 and 4. In an embodiment, the diode is a junction diode of a MOSFET.

In a preferred embodiment, the third region is coupled to a second bus which may be a ground bus.

In a preferred embodiment, the first region is an nwell, the second region is a p+ diffusion in the nwell, the third region is an n+ diffusion in the base region, and the base region is of p type.

In another embodiment, the first region is a pwell, the second region is an n+ diffusion in the pwell, the third region is a p+ diffusion in the base region, and the base region is of n type.

In another embodiments the first region is a first well of the second type, and the base region is a substrate.

In another embodiment, the first region is a first well of the second type, the base region is a second well of the first type, and the first well is within the second well. In an embodiment, the second well is constructed on a substrate of the integrated circuit. In alternative embodiment, the substrate is of the second type.

Figure 6A:
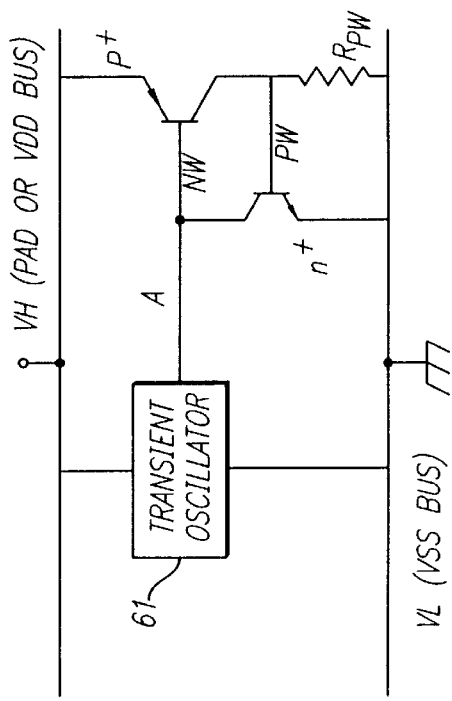
FIG. 6A shows embodiment of the invention.
Figure 6B:
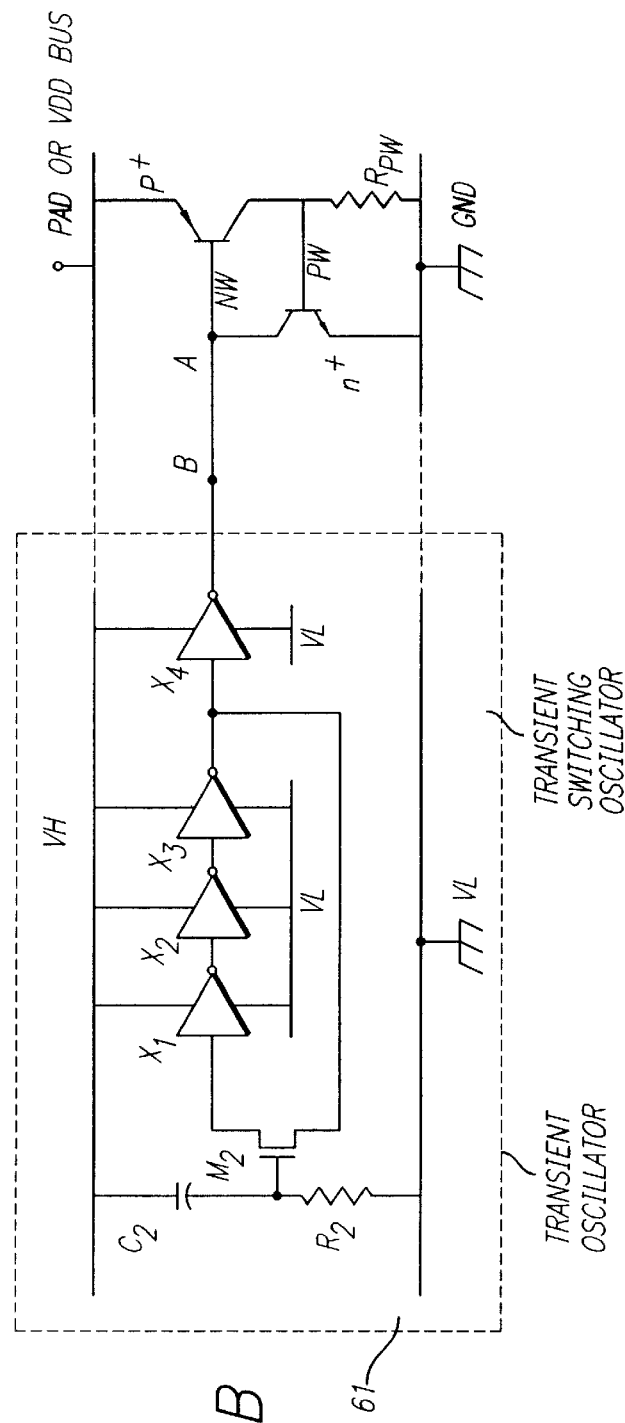
FIG. 6B shows details of the transient oscillator in FIG. 6A.

Referring to FIG. 6A, the embodiment of the invention has a transient oscillator circuit 61 for generating fast clocks during an ESD transient. FIG. 6B shows details of the transient oscillator 61, in accordance with the preferred embodiment, together with the SCR structure. The transient oscillator 61 is employed for generating fast clocks with increasing oscillation amplitude during the initial phase of an ESD transient. Also, the voltage transition of the fast clocks has a ramp rate faster than the ESD transient voltage's ramp rate. Furthermore, the voltage transition is in the opposite direction to the ESD transient voltage. As shown in FIG. 6B, the oscillator 61 is formed by a serial connection of an odd number of (at least one) voltage inverting gates. In a preferred embodiment, the voltage inverting gate is an inverter. The VH of the oscillator 61 is electrically coupled to the VDD bus, or alternatively, electrically coupled to an IC pin via a pull-up device. The VL is electrically coupled to VSS. An optional buffer means (×4) can be used to improve the drive strength of the oscillating signal at node B. During a positive VDD-to-VSS or pin-to-VSS ESD event, the voltage difference of the VH and VL of the oscillator increases rapidly along with the transient ESD voltage. As the node B is connected to the nwell of the SCR, the nwell potential is pulled more than 0.7 volts below the potential of the P+ diffusion region in nwell, wherein the P+ diffusion region is connected to the pad or Vdd bus. Lots of carriers is injected into the nwell as the P+/nwell junction is forward biased. Due to the bipolar action of the P+/nwell/ P-substrate, a large number of carriers are collected into the P-substrate thereby causing forward biasing of the N+/pwell junction that triggers SCR.

Also shown in FIG. 6B, an NMOSFET M2 is used as a transient switch. The gate of M2 is coupled to VH through a capacitor $C_2$, and coupled to VL through a resistor $R_2$. The R-C time constant is roughly 10 ns to 50 ns, which enables the oscillator circuit to oscillate for at least around 10 ns, but not much longer than that, during an ESD transient or power-up transient. On the other hand, since a powering-up event typically takes longer, or much longer, than microseconds, the gate of M2 remains at a much lower voltage than the threshold voltage required to turn on M2. Therefore, the oscillator circuit does not oscillates during normal IC operation or powering up. As a result, with the present invention, the SCR is triggered at a substantially lower voltage, say, in the range of 3 to 10 volts.

Figure 6C:
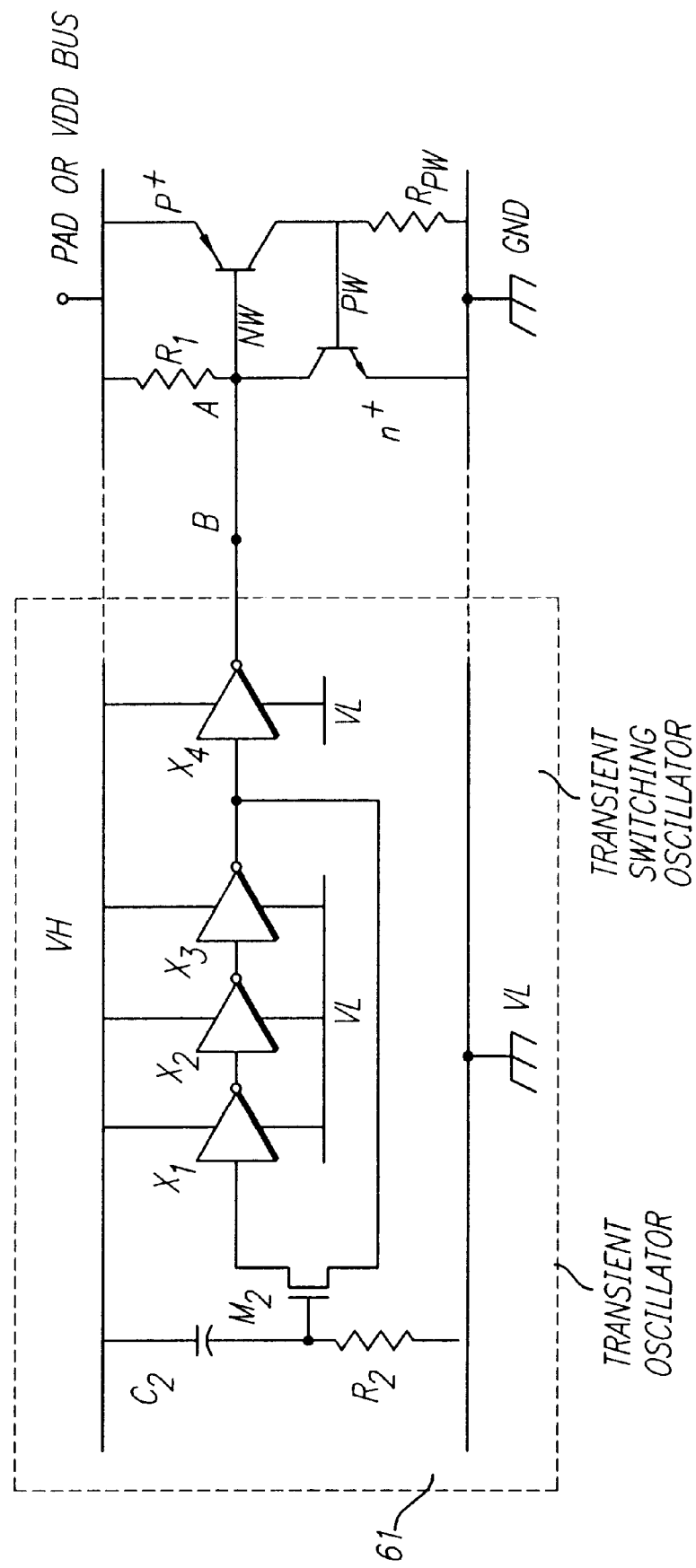
FIG. 6C shows one alternative of FIG. 6B.

FIG. 6C is a variation of FIG. 6B, where the nwell is electrically connected to the anode (pad or VDD) through a resistor R1 for better nwell potential stability against the noise-induced trigger of SCR. R1 includes the nwell resistance and the resistance of a series resistor. The time constant of R1C1 is preferably larger than the voltage-rising phase of the ESD transient, for example R1C1>50 ns, such that the SCR is easy to trigger during an ESD event. R1C1 is also preferably less than the powering up transient, for example R1C1<1µs, such that the SCR, does not trigger during normal operation or powering up.

Figure 7:
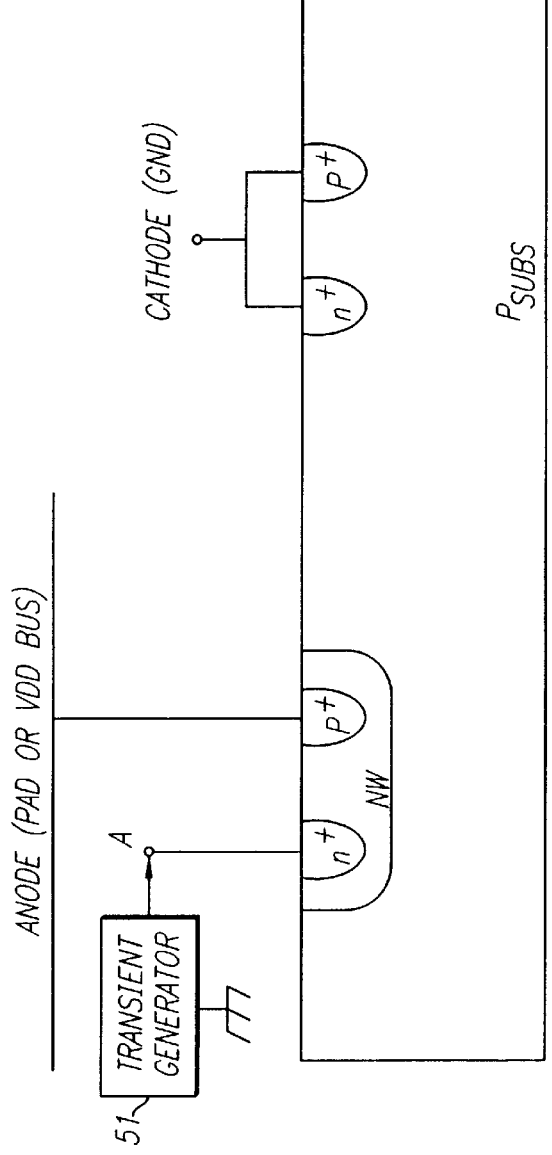
FIG. 7 shows section view of circuit in FIG. 5.

FIG. 7 shows the cross section of a conventional SCR structure with a voltage-transition circuit 51 applies the transient voltage to n+ diffusion within the nwell. The SCR-will trigger while the ESD transient voltage is still lower than the SCR trigger voltage.

Figure 8:
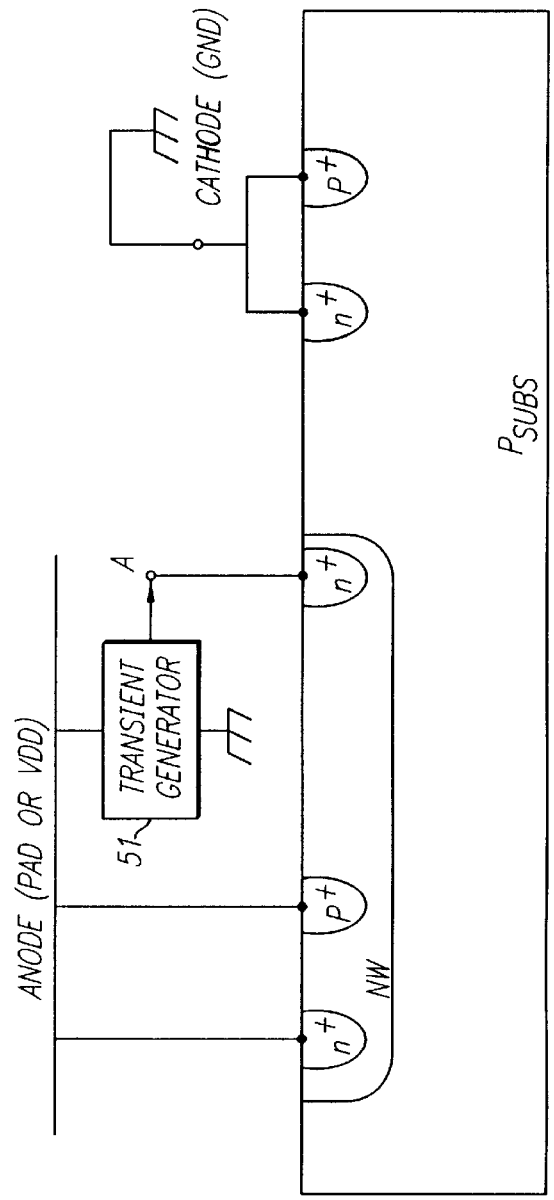
FIG. 8 shows a variation of FIG. 7.

FIG. 8 shows a variation of the structure of FIG. 7 with the nwell is electrically connected to the anode for nwell potential stability during circuit operation.

FIG. 9 shows the cross section of an LVTSCR (Low-Voltage-Trigger SCR) structure with a voltage-transition circuit 51 applying the transient voltage to the nwell through an n+ diffusion in the nwell. Since the drain junction of a NMOSFET overlaps with the nwell, the SCR will trigger at the NMOSFET trigger voltage, which is roughly 10 volt. And this occurs when the ESD transient voltage is still less than 10 volt due to the voltage-transition circuit 51. The nwell is electrically connected to the anode through an optional resistor R1 for nwell potential stability during circuit operation.

FIG. 10 shows the transient ESD voltage applied to VDD and the transient-voltage waveform of V(A), where V(A) is the output of the voltage-transition circuit 51. The simulation was based on 3 KV HBM (Human-Body-Model) and a 3 nF power bus (VDD to VSS) capacitance. As shown in the graph, during the initial phase of the ESD event, V(A) is pulled below VDD and pinned at roughly VDD—0.8 volts when the P+/nwell junction is forward biased. The combination of the increasing value of VDD with the time together with the carrier injection caused by the forward biased P+/nwell junction eventually force the SCR to trigger in the early stage of the ESD transient.

According to the present invention, the transient oscillator 61 functions to provide at least one voltage switching during the ESD transient to generate at least one transient voltage pulse to trigger the SCR device. Therefore, it is apparent to persons skillful in the arts that the transient oscillator 61 described in this invention can be substituted by any other switching circuit capable of providing one or multiple voltage switchings during the initial ESD transient which triggers the SCR to conduct large amount of ESD current.

What is claimed is:

1. An electrostatic discharge (ESD) protection structure for an integrated circuit constructed on a base region of a first type, comprising:

a semiconductor controlled rectifier (SCR) constructed on the base region and coupled to said integrated circuit, said SCR including a first region of a second type formed next to said base region, a second region of the first type formed in the first region, and a third region of the second type formed in said base region; and a transient voltage-transition circuit coupled to the first region, said transient voltage-transition circuit providing a voltage transition for forward-biasing a junction of the second region and the first region at least once during an ESD transient event by directly injecting a trigger current into the first region for earlier triggering of said SCR during the ESD event.

2. The structure of claim 1, wherein said voltage transition has a ramp rate faster than the ESD transient voltage's ramp rate.

3. The structure of claim 1, wherein the voltage transition is in the opposite direction to the ESD transient voltage.

4. The structure of claim 1, wherein said second region couples to a first bus electrically coupled to an ESD transient voltage source.

5. The structure of claim 4, wherein said first bus is a power bus.

6. The structure of claim 4, further comprising a diode disposed between said first bus and an IC pin receiving the ESD transient voltage.

7. The structure of claim 6, wherein said diode is a junction diode of a MOSFET.

8. The structure of claim 1, wherein the third region couples to a second bus.

9. The structure of claim 8, wherein the second bus is a ground bus.

10. The structure of claim 1, wherein a transient voltage of said second region varies in response to the ESD transient voltage, a transient voltage of said first region varies in response to the ESD transient voltage, the transient voltage of said first region is of a smaller magnitude than the transient voltage of said second region for at least once during the ESD transient.

11. The structure of claim 1, wherein the voltage transition circuit comprises an oscillation means having an output terminal for generating an oscillation signal during an ESD event.

12. The structure of claim 11, further comprising a delay-switch means operative to turn on the oscillation means for at least a time period during the ESD event.

13. The structure of claim 12, wherein the oscillation means comprises:

N voltage inverting gates serially connected to each other, N is an odd number, the last of the N voltage inverting gates generates the oscillation signal at an output terminal thereof.

14. The structure of claim 13, wherein the delay-switch means comprises:

a switch means having an input node, an output node and a control node, wherein said input node connects to the output terminal of the last of N voltage inverting gates, said output node connects to an input terminal of the first of N voltage inverting gates;

a control signal generator for generating a control signal to said control node of the switch means to turn on the switch means for at least a time period during the ESD event.

15. The structure of claim 14, wherein said control signal keeps said switch means off during normal operation of the integrated circuit.

16. The structure of claim 14, wherein said control signal keeps said switch means off during power-on operation of the integrated circuit.

17. The structure of claim 14, wherein said control signal generator includes an RC circuit having a resistor and a capacitor with one common joint terminal generating the control signal.

18. The structure of claim 14, wherein said switch means is a MOSFET transistor, and said control node is a gate of the MOSFET transistor.

19. An electrostatic discharge (ESD) protection structure for an integrated circuit constructed on a base region of a first type, comprising:

a semiconductor controlled rectifier (SCR) constructed on the base region and coupled to said integrated circuit, said SCR including a first region of a second type formed next to said base region, a second region of the first type formed in the first region, and a third region of the second type formed in said base region; and a voltage transition means having an output terminal, wherein the voltage-transition means is capable of being powered by an ESD transient voltage, and the output terminal of the voltage transition means is coupled to the first region for directly injecting a trigger current into the first region during an ESD event for earlier triggering of said SCR during the ESD event.

20. The structure of claim 19, wherein said second region electrically couples to an IC pin.

21. The structure of claim 19, wherein said second region couples to a first bus.

22. The structure of claim 21, wherein said first bus is a power bus.

23. The structure of claim 19, wherein the third region couples to a second bus.

24. The structure of claim 23, wherein the second bus is a ground bus.

25. The structure of claim 19, wherein said voltage transition has a ramp rate faster than the ESD transient voltage's ramp rate.

26. The structure of claim 19, wherein the voltage transition circuit comprises an oscillation means having an output terminal, which is connected to the first region, for generating an oscillation signal during an ESD event.

27. The structure of claim 19, wherein the first region couples to a ground bus.

* * * * *